(12) United States Patent
Buijsse et al.

(10) Patent No.: US 11,004,655 B2
(45) Date of Patent: May 11, 2021

(54) DIFFRACTION PATTERN DETECTION IN A TRANSMISSION CHARGED PARTICLE MICROSCOPE

(71) Applicant: FEI Company, Hillsboro, OR (US)

(72) Inventors: Bart Buijsse, Eindhoven (NL); Maarten Kuijper, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/738,992

(22) Filed: Jan. 9, 2020

(65) Prior Publication Data

US 2020/0144022 A1 May 7, 2020

Related U.S. Application Data

(63) Continuation of application No. 15/998,757, filed on Aug. 16, 2018, now Pat. No. 10,651,008.

(30) Foreign Application Priority Data

Aug. 17, 2017 (EP) ..................................... 17186546

(51) Int. Cl.
*H01J 37/26* (2006.01)
*H01J 37/22* (2006.01)
*H01J 37/147* (2006.01)
*H01J 37/244* (2006.01)

(52) U.S. Cl.
CPC .......... *H01J 37/222* (2013.01); *H01J 37/147* (2013.01); *H01J 37/244* (2013.01); *H01J 37/26* (2013.01); *H01J 2237/226* (2013.01); *H01J 2237/2446* (2013.01); *H01J 2237/24455* (2013.01); *H01J 2237/24495* (2013.01); *H01J 2237/2605* (2013.01); *H01J 2237/2617* (2013.01); *H01J 2237/2802* (2013.01); *H01J 2237/2803* (2013.01); *H01J 2237/2809* (2013.01)

(58) Field of Classification Search
CPC ........ H01J 37/222; H01J 37/147; H01J 37/26; H01J 2237/226; H01J 37/244; H01J 2237/2809; H01J 2237/2803; H01J 2237/2802; H01J 2237/2617; H01J 2237/2605; H01J 2237/24495; H01J 2237/2446; H01J 2237/24455; H01J 37/28
USPC ................................ 250/306, 307, 310, 311
See application file for complete search history.

(56) References Cited

U.S. PATENT DOCUMENTS 10,651,008 B2 * 5/2020 Buijsse ................. H01J 37/222

* cited by examiner

*Primary Examiner* — Michael Maskell

(57) ABSTRACT

Techniques of using a Transmission Charged Particle Microscope for diffraction pattern detection are disclosed. An example method including irradiating at least a portion of a specimen with a charged particle beam, using an imaging system to collect charged particles that traverse the specimen during said irradiation, and to direct them onto a detector configured to operate in a particle counting mode, using said detector to record a diffraction pattern of said irradiated portion of the specimen, recording said diffraction pattern iteratively in a series of successive detection frames, and during recording of each frame, using a scanning assembly for causing relative motion of said diffraction pattern and said detector, so as to cause each local intensity maximum in said pattern to trace out a locus on said detector.

20 Claims, 2 Drawing Sheets

DIFFRACTION PATTERN DETECTION IN A TRANSMISSION CHARGED PARTICLE MICROSCOPE

BACKGROUND OF THE INVENTION

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (MID), for example. More specifically:

In an SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance.

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components: A particle source, such as an electron source or ion source. An illuminator (e.g., a charged particle beam column), which serves to manipulate a "raw" radiation beam from the particle source and perform upon it certain operations such as focusing, aberration mitigation, cropping (e.g., with a diaphragm), filtering, etc. It will generally comprise one or more (charged-particle) lenses, and may comprise other types of (particle-)optical components also. If desired, the illuminator can be provided with a deflector system that can be invoked to cause the exit beam to perform a scanning motion across the specimen being investigated. A specimen holder on which a specimen under investigation can be held and positioned (e.g. tilted, rotated). If desired, this holder can be moved so as to effect scanning motion of the specimen with respect to the beam. In general, such a specimen holder will be connected to a positioning system. When designed to hold cryogenic specimens, the specimen holder can comprise means for maintaining said specimen at cryogenic temperatures, e.g. using an appropriately connected cryogen vat. A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), a CPM will additionally comprise: An imaging system, which essentially takes charged particles that are transmitted through a specimen (plane) and directs (focuses) them onto analysis apparatus, such as a detection/imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the techniques disclosed herein may—by way of example—sometimes be set forth in the specific context of electron microscopy; however, such simplification is intended solely for clarity/illustrative purposes, and should not be interpreted as limiting.

Charged-particle irradiation generally causes radiation damage to specimens, especially biological samples. Consequently, in (for example) life science TEM applications, it is desirable to work at relatively low-dose illumination conditions, in an attempt to minimize radiation damage to the specimen. Such low-dose operation, however, tends to cause a degradation in signal quality. These conflicting effects present the TCPM (Transmission Charged Particle Microscope) operator with a conundrum.

SUMMARY OF THE INVENTION

The invention relates to a method of using a Transmission Charged Particle Microscope (TCPM), comprising: Providing a specimen on a specimen holder; Using a charged particle beam column to produce a charged particle beam and irradiate at least a portion of the specimen therewith; Using an imaging system to collect charged particles that traverse the specimen during said irradiation, and to direct them onto a detector; and Using said detector to record a diffraction pattern of said irradiated portion of the specimen. The invention also relates to a charged particle microscope in which such a method can be enacted.

It is an object of the present disclosure to address this issue. More specifically, it is an object of the present disclosure to provide means by which a TCPM can be used to record diffraction patterns at relatively low dose and yet with a satisfactory signal quality.

These and other objects are achieved in a method as set forth in the opening paragraph above, further characterized by: configuring said detector to operate in particle counting mode; recording said diffraction pattern iteratively in a series of successive detection frames, and summing said frames; and during recording of each frame, causing relative motion of said diffraction pattern and said detector, so as to cause each local intensity maximum in said pattern to trace out a locus on said detector.

The skilled artisan will be familiar with the concept of a detection frame (or just "frame") as here alluded to—e.g. by analogy to the way in which a television picture is captured at a certain number of "frames" per second, for instance. In essence, a detection frame $F_n$ represents the content captured and read-out from a pixel array in a particular temporal interval $T_n$—which process can be repeated during an extended time lapse so as to acquire a series of successively-captured frames $\{F_n, F_{n+1}, F_{n+2}, \ldots\}$. It should be noted that the pixel array in question may constitute the entire of the detection surface of the employed detector, or just a subset thereof. In this latter context, it should be noted that, for example, the detection surface of a CMOS detector can be sub-divided into a number of constituent pixel arrays (subsets), each of which can, if desired, be read out at different rates; in such an instance, the "frame" of the present invention can be regarded as referring to content from a given one of such subsets, whose constituent pixels are read out together.

The principles underlying the present disclosure can be set forth as follows:

Use of a detector/camera with a relatively high Detective Quantum Efficiency (DQE) will help to optimize the detected signal in low-dose situations. In the invention, such a high DQE is achieved over a wide/full spatial frequency regime by applying so-called particle counting techniques, e.g. using direct electron detectors.

When registering diffraction patterns, such particle counting cannot be applied in a straightforward manner, because the signal/pattern to be detected is concentrated in localized, intense peaks (intensity maxima/bright spots). Particle hit rates in the most intense part of a diffraction pattern are very high. In order to avoid compromised counting statistics (associated with the detector's inevitable "dead time" between hits, and so-called "pile ups"/coincidence loss), the hit rate for counting must therefore be kept relatively low (e.g. not exceeding 1 particle per 20-40 frames). Accordingly, even with a very fast camera (e.g. ca. 200-400 frames/s) the admissible count rate per pixel (e.g. 10 particles/pixel/s) will tend to be too low for practical purposes.

The invention addresses this problem by imposing a (small) beam/detector relative motion during each frame recording, thereby causing each bright spot in the diffraction pattern to be "smeared out" along a locus that intercepts a number N of pixels, e.g., a plurality of pixels, of the detector. In this way, the average dose rate per pixel is reduced, e.g., by a factor N, and pile-ups—if they occur—will impact different pixels along the locus, thereby allowing them to be "resolved" into individual hits. As a result, a higher count rate can be realized, and counting can thus become a practicable way of (inter alia) recording relatively weak diffraction spots in low-dose diffraction patterns.

Because the diffraction pattern is moved (relative to the detector) according to a known locus, the original (unmoved) diffraction pattern can be restored computationally, by applying a straightforward deconvolution to each frame (to nullify the effect of the motion). In this way, the positions and intensities of peaks/maxima in (complex/crowded) diffraction patterns can be very accurately determined.

The techniques disclosed herein, inter alia, mitigates the problem of recording weak diffraction peaks in low-dose (complex) diffraction patterns of organic crystals (such as proteins, for example). Such weak diffraction peaks often contain the highest-resolution information, so that application of the techniques is accordingly expected to reveal higher-resolution structures in organic molecules in electron crystallography studies, for example. The same expectation applies to low-dose inorganic samples, such as certain polymeric and zeolite samples, for instance. Another problem that is addressed by the techniques is that the risk of detector damage can be reduced, by smearing out the high-intensity peaks over several pixels of the detection surface, thus reducing the dose-per-pixel. And, as already mentioned above, miscounts due to pile-ups are mitigated, since the constituent events of pile-ups can be resolved (because they are registered by different pixels on the abovementioned locus). Note that, by its very essence, the techniques are counter-intuitive: normally, one tries to avoid intra-frame relative motion of the diffraction pattern and detector—e.g. due to vibration or thermal drift—whereas, in the disclosed techniques, one is deliberately producing and exploiting relative motion of the two.

The abovementioned relative motion of the diffraction pattern/detector can be effected using a scanning assembly selected from the group comprising: (i) a beam deflection module (e.g. comprising deflection coils/electrodes) located between the specimen and detector, to displace the diffraction pattern upon the detector; (ii) an actuator module (e.g. motorized stage) connected to the detector, to displace the detector relative to the diffraction pattern, and combinations thereof. Beam scanning ((i)) is the traditional approach used in scanning-type CPMs (such as SEMs and STEMs), though the current disclosure will require its modification (to occur after/below rather than before/above the specimen). Approach (ii) is less common in CPMs, though this does not have to present a technical hurdle, since sophisticated scanning stages are already used in fields such as lithography, and are available in many different implementations.

In an embodiment of the present disclosure, an amplitude of said relative motion is selected such that, for any given first and second local intensity maximum in the diffraction pattern being recorded, the corresponding first and second loci do not mutually intersect. Such an embodiment essentially ensures that the pattern is not smeared out across itself, i.e. the loci followed by neighboring bright spots do not cross each other's paths. Put another way: if the selected locus fits within a smallest area, e.g., unit cell, neighboring unit cells do not overlap. Such motion simplifies the deconvolution task referred to above. It should be noted, however, that this is not a mandatory pre-condition: if desired, the chosen locus may violate this rule, though this will (somewhat) complicate distillation of the original (static) diffraction pattern from the smeared out version on the detector.

As regards the selected locus, this may have different possible forms, such as a straight line segment or arc, for example. Alternatively, it may be a closed curve, such as a circle, ellipse or oval, for example. An advantage of a closed curve is that it can have coincident starting and finishing points, which can be advantageous from the point of view of scanning mechanics (via-à-vis effects such as hysteresis, reversal, jerk, etc.—which are pertinent to both motional approaches (i) and (ii) above). With reference to the previous paragraph, and by way of illustrative example: if the two closest spots in a given pattern are separated by 20 detector pixels (for instance), then a circular locus of diameter <20 pixels will avoid the abovementioned intersection phenomenon. An advantage of a circular locus (for example) is that its geometric center can be determined with just three particle hits along its circumference. A circular locus also optimally avoids the above-mentioned intersection/overlapping issue, since it has the same "width" (diameter/amplitude) in all directions.

It should be noted that a diffraction pattern may be inspected at a discrete number of different tilt values of the specimen involved; in such a situation, in the context of the present invention, a summed series of frames can be acquired for each distinct tilt value. A similar consideration applies in the case of a specimen that undergoes a chemical/ physical change; in such an instance, a summed series of frames can be separately acquired before and after the change concerned.

The detector used in the invention may, for example, comprise a CCD (Charge-Coupled Device). Alternatively, as alluded to above, it could comprise a CMOS (Complementary Metal Oxide Semiconductor) sensor, for example. A possible advantage of a CMOS sensor is that it allows adaptive readout rates—e.g. allowing a first detector region receiving a relatively strong signal (e.g. surrounding the central/zero-order peak of a diffraction pattern) to be read out more frequently (e.g. twice or three times more frequently) than a second detector region receiving a relatively weak signal (e.g. near a higher-order, subordinate diffraction peak), and thus allowing an improvement in overall dynamic range; for instance, in the specific context of the present disclosure, said first detector region could be read out after completion of each motional locus (frequency $f_1$), whereas said second detector region could be read out after completion of each pair of motional loci (frequency $f_2 = \frac{1}{2} f_1$).

In principle, the disclosed method may be considered to suffer some limitation in a situation in which the diffraction peaks are superimposed on a strong background signal; however, usually, such a background contribution is relatively low—especially if zero-loss energy-filtering is applied. This is therefore not a significant issue.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

In the Figures, where pertinent, corresponding parts are indicated using corresponding reference symbols.

DETAILED DESCRIPTION OF EMBODIMENTS

Embodiment 1

Figure 1:
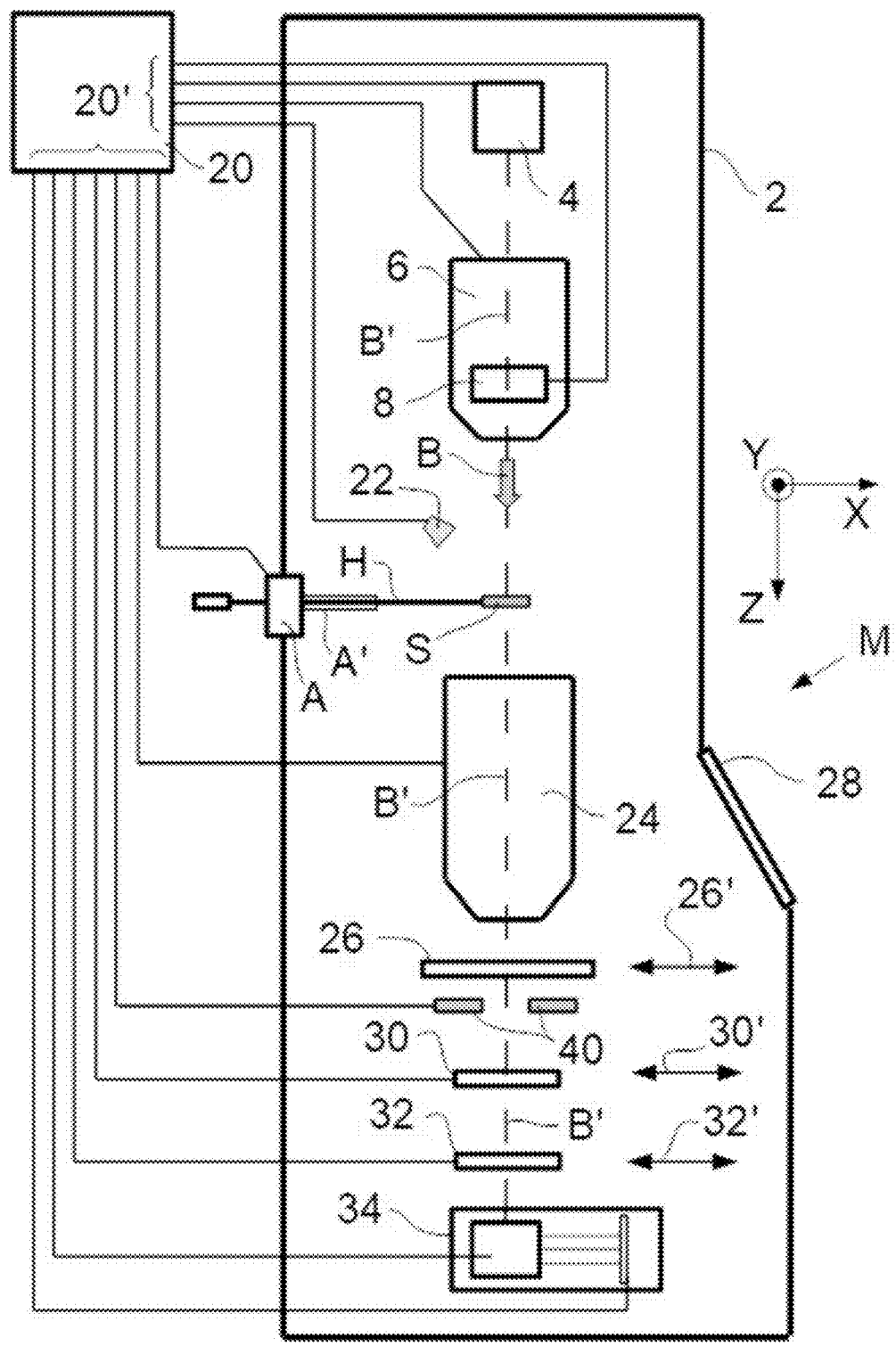
FIG. 1 renders a longitudinal cross-sectional elevation view of an embodiment of a TCPM in which the present invention is implemented.

FIG. 1 (not to scale) is a highly schematic depiction of an embodiment of a TCPM M in which the present invention is implemented; more specifically, it shows an embodiment of a TEM/STEM (though, in the context of the current disclosure, it could just as validly be an ion-based microscope, for example). In the Figure, within a vacuum enclosure 2, an electron source 4 produces a beam B of electrons that propagates along an electron-optical axis B' and traverses an electron-optical illuminator (charged particle beam column) 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in an SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34.

Figure 2:
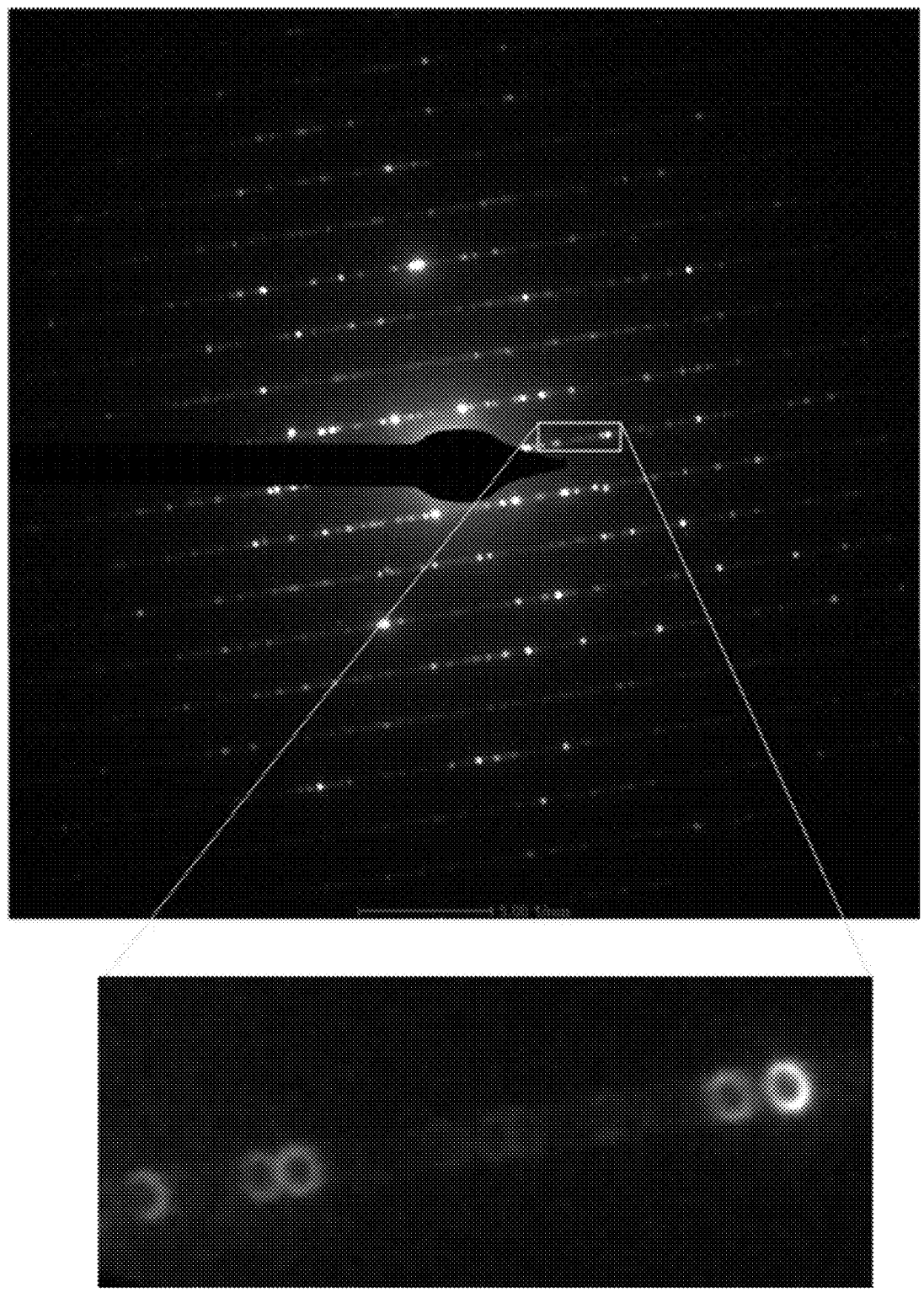
FIG. 2 shows an example of a diffraction pattern of an asbestos specimen, recorded using an embodiment of the present invention.

In the context of the present disclosure, a beam deflector module 40 is provided between imaging system 24 and TEM camera 30, so as to be able to laterally deflect electrons emerging from imaging system 24—more specifically, to cause said electrons to trace out a controllable locus (in the XY plane) upon a detection surface of camera 30. Alternatively/supplementally, camera 30 may be mounted on a fine XY motional stage, so as to achieve the same ultimate effect via detector motion rather than beam motion. A combination of both beam deflection and detector movement may also be implemented. With camera 30 operating in electron counting mode, said locus is traced out (one or more times) during recording of each constituent frame in a multi-frame diffraction measurement series—thereby registering a diffraction pattern in which constituent bright spots are replaced by individual versions of the traced-out locus. Such a scenario is depicted in FIG. 2, for example, which show a diffraction pattern of an asbestos specimen, obtained using the disclosed method in conjunction with a circular locus. The lower portion of FIG. 2 renders a magnified view of the content of the white inset/box in the upper portion of FIG. 2, and clearly shows the circular locus traced out by the various diffraction spots. The individual electron hits along each locus are summed/integrated so as to give a cumulative electron dose/intensity for each spot in the pattern.

The invention claimed is:

1. A method of using a Transmission Charged Particle Microscope, comprising:
    using a charged particle beam column to irradiate at least a portion of a specimen with a charged particle beam;
    using a detector to detect charged particles that traverse the specimen during the irradiation, wherein the detector is configured to operate in a particle counting mode;
    using the detector to record a diffraction pattern of the at least a portion of the specimen in at least one detection frame; and
    during the recording of each detection frame of the at least one detection frame, using a scanning assembly to cause relative motion of said diffraction pattern and said detector, so as to cause each local intensity maximum in said pattern to trace out a locus on said detector.

2. A method according to claim 1, wherein the scanning assembly is selected from the group comprising:
    a beam deflection module located between the specimen and the detector, to displace the diffraction pattern upon the detector;
    an actuator module connected to the detector, to displace the detector relative to the diffraction pattern, and
    a combination thereof.

3. A method according to claim 1, wherein an amplitude of the relative motion is selected such that, for any given first and second local intensity maximum, the corresponding first and second loci do not mutually intersect.

4. The method of claim 1, further comprising deconvolving each frame of the at least one detection frame to nullify the effect of the relative motion.

5. A method according to claim 1, wherein said locus is a closed curve.

6. A method according to claim 1, wherein said locus is one of an arc or a straight line.

7. A method according to claim 1, wherein the detector comprises a CMOS sensor having a first sensor region that receives a relatively strong signal and a second sensor region that receives a relatively weak signal, and wherein the first sensor region is read out more frequently than the second sensor region.

8. A transmission charged particle microscope comprising:
    a specimen holder, for holding a specimen;
    a charged particle beam column, for producing a charged particle beam and irradiating at least a portion of the specimen therewith;
    a detector configured to record a diffraction pattern of said irradiated portion of the specimen; and
    a controller, for controlling one or more operational aspects of the microscope, configured to:
        operate said detector in particle counting mode;
        record said diffraction pattern in at least one detection frame; and
        during recording of each detection frame of the at least one detection frame, invoke a scanning assembly to effect relative motion of said diffraction pattern and said detector so as to cause each local intensity maximum in said pattern to trace out a locus on said detector.

9. The transmission charged particle microscope of claim 8, wherein the scanning assembly is selected from the group comprising:
    a beam deflection module located between the specimen and the detector, to displace the diffraction pattern upon the detector;
    an actuator module connected to the detector, to displace the detector relative to the diffraction pattern, and
    a combination thereof.

10. The transmission charged particle microscope of claim 8, wherein an amplitude of said relative motion is selected such that, for any given first and second local intensity maximum, corresponding first and second loci do not mutually intersect.

11. The transmission charged particle microscope of claim 8, wherein the controller is further configured to deconvolve each frame of the at least one detection frame to nullify the effect of the relative motion.

12. The transmission charged particle microscope of claim 8, wherein said locus is a closed curve.

13. The transmission charged particle microscope of claim 12, wherein said locus is circular.

14. The transmission charged particle microscope of claim 8, wherein:
- said detector comprise a CMOS sensor; and
- a first sensor region receiving a relatively strong signal is read out more frequently than a second sensor region receiving a relatively weak signal.

15. A method comprising:
- operating a detector of a charged particle microscope in a particle counting mode;
- irradiating a sample with a charged particle beam;
    - recording, by the detector, a diffraction pattern of the irradiated sample in one or more detection frames, the diffraction pattern formed in response to the charged particle beam traversing the sample; and
    - while recording each frame of the one or more detection frames, causing, by a scanning assembly, relative motion of the diffraction pattern and the detector to cause each local intensity maximum of the diffraction pattern to trace out a path on the detector.

16. The method of claim 15, further comprising deconvolving each frame of the one or more detection frames to nullify the effect of the relative motion.

17. The method of claim 16, wherein the deconvolving restores an original diffraction pattern.

18. The method of claim 15, wherein the causing, by the scanning assembly, the relative motion of the diffraction pattern and the detector comprises one of:
- deflecting the beam of charged particle to trace out the path on the detector;
- displacing the detector to trace out the path on the detector; and
- a combination thereof.

19. The method of claim 15, wherein the relative motion of the diffraction pattern and the detector is such that corresponding loci of adjacent intensity maxima of the diffraction pattern do not overlap.

20. The method of claim 15, wherein the path is a circle.

* * * * *